(12) United States Patent
Park et al.

(10) Patent No.: US 8,159,413 B2
(45) Date of Patent: Apr. 17, 2012

(54) DOUBLE-STACKED EBG STRUCTURE

(75) Inventors: Jongbae Park, Daejeon (KR); Chee Wai Albert Lu, Singapore (SG); Joungho Kim, Daejeon (KR)

(73) Assignee: Agency for Science, Technology and Research, Connexis (FR)

( * ) Notice: Subject to any disclaimer, the term of this patent is extended or adjusted under 35 U.S.C. 154(b) by 157 days.

(21) Appl. No.: 12/513,354

(22) PCT Filed: Nov. 1, 2006

(86) PCT No.: PCT/SG2006/000322
§ 371 (c)(1),
(2), (4) Date: May 1, 2009

(87) PCT Pub. No.: WO2008/054324
PCT Pub. Date: May 8, 2008

(65) Prior Publication Data
US 2010/0108373 A1    May 6, 2010

(51) Int. Cl.
*H01Q 15/02* (2006.01)
(52) U.S. Cl. ................. 343/909; 343/700 MS
(58) Field of Classification Search ........... 343/700 MS, 343/909
See application file for complete search history.

(56) References Cited

U.S. PATENT DOCUMENTS

| 7,136,029 B2 * | 11/2006 | Ramprasad et al. .......... 343/909 |
| 2005/0194169 A1 | 9/2005 | Tonomura | |
| 2007/0001926 A1 * | 1/2007 | Waltho .......................... 343/909 |

FOREIGN PATENT DOCUMENTS

| WO | WO 2005/002295 A2 | 1/2005 |
| WO | WO 2005/076408 A1 | 8/2005 |

OTHER PUBLICATIONS

Park et al., "Double-Stacked EBG Structure for Wideband Suppression of Simultaneous Switching Noise in LTCC-based SiP Applications", IEEE Microwave and Wireless Components Letters, Sep. 2006, pp. 481-483, vol. 16, No. 9.

* cited by examiner

*Primary Examiner* — Dieu H Duong
(74) *Attorney, Agent, or Firm* — McDermott Will & Emery LLP

(57) ABSTRACT

In a double-stacked electromagnetic bandgap (EBG) structure, a first conductive plane and a second conductive plane are spaced apart in parallel. At least two EBG layers are embedded in parallel between the first conductive plane and the second conductive plane. The at least two EBG layers have different stopband characteristics. A plurality of vias connect the at least two EBG layers respectively to one of the first and second conductive planes. At least the vias connecting one of the EBG layers pass through via holes in cells of another EBG layer.

25 Claims, 6 Drawing Sheets

DOUBLE-STACKED EBG STRUCTURE

FIELD OF THE INVENTION

The present invention relates broadly to an electromagnetic bandgap (EBG) structure, to an electronic device, and to a method for suppressing electromagnetic noise in an electronic device.

BACKGROUND

In the semiconductor electronic devices that process digital signals and analog signals at the same time, semiconductor devices processing the digital signals and semiconductor devices processing the analog signals are separately fabricated and then are assembled together. As the semiconductor electronic devices are scaled down, techniques for processing the digital signals and the analog signals within a single semiconductor device have been developed.

Bluetooth modules or RFID modules are representative semiconductor devices having both digital signal processing circuits and analog signal processing circuits. These modules include digital circuits (e.g., memory, arithmetic unit, etc.) and RF analog circuits (e.g., RF amp, PLL, antenna, etc.) within a single semiconductor package. These modules are called a mixed signal system. In a single semiconductor package, a plurality of semiconductor devices and a plurality of passive circuits manufactured by various processes are integrated into a single system. Thus, the semiconductor package is typically known as a system-in-package (SiP).

In the system-in-package processing the mixed signals, a digital circuit part and an analog circuit part may share a common power plane and a ground plane parallel to each other, and may use them separately. In any case, the two circuit parts are coupled directly or indirectly through various electromagnetic mechanisms. An issue is a wideband switching noise that is generated by a switching operation and clock signal of the digital circuit part and is inherently propagated to the analog circuit part. The power plane/ground plane may be considered as a kind of a parallel plate waveguide. A plurality of vias formed in the power plane/ground plane operates as an antenna receiving the switching nose. Because the switching noise has a wideband, it overlaps an analog signal band at which the analog circuit part operates. In addition, because the analog circuit is very sensitive to the switching noise, it is very important to suppress the switching noise.

Various approaches to reduce the switching noise when the parallel plate power plane/ground plane have been developed. Examples of the approaches include a method for suppressing resonance generated in a cavity between two plates, for example, a method for attenuating RF signals using absorbent or loss component, and a method for dividing a power plane. However, these methods are effective only to an electromagnetic wave having a band of a few hundreds MHz and a limited directionality and within a restricted region.

An electromagnetic bandgap (EBG) structure has been developed to suppress a surface current generated in an RF analog device. The EBG structure is inserted between the power plane and the ground plane and operates as an RF bandstop filter. The EBG structure is very effective to an electromagnetic wave of GHz having a planar omnidirectional characteristic and extends along the SiP and can be implemented at a low cost.

FIG. 1 is a perspective view of a conventional EBG structure. Referring to FIG. 1, the conventional EBG structure 10 includes a power plane 11, a ground plane 12, and an EBG layer 13. The power plane 11 and the ground plane 12 are arranged parallel to each other, and the EBG layer 13 is embedded between the two planes 11 and 12. The EBG layer 13 is connected to one of the two planes 11 and 12 through vias 14. In the case of FIG. 1, the EBG layer 13 is connected to the ground plane 12. The EBG layer 13 is divided into cells that are repetitively arranged at constant periods. The via 14 connects the EBG layer 13 to one of the two planes 11 and 12 at each cell. A dielectric having a predetermined permittivity is filled between the EBG layer 13 and the two planes 11 and 12. Because a low-temperature co-fired ceramic (LTCC) has a frequency stable permittivity property and a low loss, it is widely used as the dielectric.

The ground plane 12 and the EBG layer 13 have a self-inductance that is determined depending on their physical shapes. The power plane 11 and the EBG layer 13 have a predetermined capacitance that is determined depending on the gap between the cells, the permittivity of the fill material, and the size of the cells. A stopband center frequency of the EBG structure 10 changes depending on the self-inductance and the capacitance. Specifically, it is known that the stopband center frequency is proportional to $\sqrt{L/C}$. Therefore, the EBG structure 10 can set the desired suppression band as the stopband by determining the L/C ratio. As the capacitance increases, the stopband width increases.

In this manner, by adjusting the gap, permittivity, and size of the cells of the EBG layer 13, the bandstop filter having stopbands of different center frequencies and different bandwidths can be implemented using the EBG structure 10. For example, when the cell size is small, the capacitance becomes small and the frequency of the stopband becomes high. In this case, however, the stopband width becomes narrow. When the stopband width has to be large for a small size of the package or board, the conventional EBG structure 10 cannot properly meet such a requirement.

Double-stacked EBG structures have also been proposed, to provide a broader effective stopband bandwidths. In such double-stacked EBG structures, the individual EBG layers can be designed to achieve different center frequencies and stopbands. More particular, two different cell sizes can be used for the two EBG layers, and alternatively or additionally different permittivity dielectric layers can be used for the respective EBG layers to achieve different center frequencies and stopbands. However, the proposed structures have the disadvantage of limiting the size variations of the cells due to accommodating respective vias for connection of the cells to the power the ground planes in gaps between the cells. As a result, the proposed designs are limited by low start frequencies for the effective stopband bandwidths. Furthermore, design variation based on using different permittivity dielectric layers has the disadvantage of having to integrate multiple dielectrics with different mechanical and processing properties.

A need therefore exists to provide an alternative double-stacked EBG structure that seeks to address at least one of the above problems.

SUMMARY OF THE INVENTION

In accordance with a first aspect of the present invention there is provided a double-stacked electromagnetic bandgap (EBG) structure comprising a first conductive plane and a second conductive plane spaced apart in parallel; at least two EBG layers embedded in parallel between the first conductive plane and the second conductive plane, the at least two EBG layers having different stopband characteristics; and a plurality of vias for connecting the at least two EBG layers respectively to one of the first and second conductive planes;

wherein at least the vias connecting one of the EBG layers pass through via holes in cells of another EBG layer.

The at least two EBG layers may be formed such that the stopbands are contiguous.

The at least two EBG layers may have different cell sizes.

The first conductive plane may be a power plane and the second conductive plane may be a ground plane.

The cell size of the EBG layer connected to the power plane may be smaller than that of the EBG layer connected to the ground plane.

The cells may have a substantially rectangular shape.

The double-stacked EBG structure may further comprise a non-conductive layer or a dielectric layer formed between the conductive planes and the EBG layers.

The dielectric layer may be a low-temperature co-fired ceramic (LTCC).

The dielectric layers between the conductive layers and the respective EBG layers may have a uniform thickness.

A ratio of a cell size in one EBG layer to a cell size in another EBG layer may be equal to or greater than 2:1.

Each cell in one EBG layer may overlap an integer number of cells in another EBG layer.

In accordance with a second aspect of the present invention there is provided an electronic device comprising an electronic circuit having a predetermined function; and a board for suppressing propagation of switching noise, the board including a first conductive plane and a second conductive plane spaced apart in parallel; at least two EBG layers embedded in parallel between the first conductive plane and the second conductive ground plane, the at least two EBG layers having different stopband characteristics; and a plurality of vias for connecting the at least two EBG layers respectively to one of the first and second conducive planes; wherein at least the vias connecting one of the EBG layers pass through via holes in cells of another EBG layer.

The electronic circuit may be a mixed signal semiconductor circuit to process both a digital signal and an analog signal, and the electronic device is a system-in-package.

The at least two EBG layers may be formed such that the stopbands are contiguous.

The at least two EBG layers may have different cell sizes.

The first conductive plane may be a power plane and the second conductive plane may be a ground plane.

The cell size of the EBG layer connected to the power plane may be smaller than that of the EBG layer connected to the ground plane.

The cells may have a rectangular shape.

The electronic device may further comprise a non-conductive layer or a dielectric layer formed between the conductive planes and the EBG layers.

The dielectric layer may comprise a low-temperature co-fired ceramic (LTCC) dielectric layer.

The dielectric layers between the conductive layers and the respective EBG layers may have a uniform thickness.

A ratio of a cell size in one EBG layer to a cell size in another EBG layer may be equal to or greater than 2:1.

Each cell in one EBG layer may overlap an integer number of cells in another EBG layer.

In accordance with a third aspect of the present invention there is provided a method for suppressing electromagnetic noise in an electronic device having a first conductive plane and a second conductive plane, comprising forming at least two EBG layers having different stopbands between the first conductive plane and the second conductive plane in parallel; and connecting the at least two EBG layers respectively to one of the first and second conductive planes through a plurality of vias; wherein at least the vias connecting one of the EBG layers pass through via holes in cells of another EBG layer.

The at least two EBG layers may be formed such that the stopbands are contiguous.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 2:
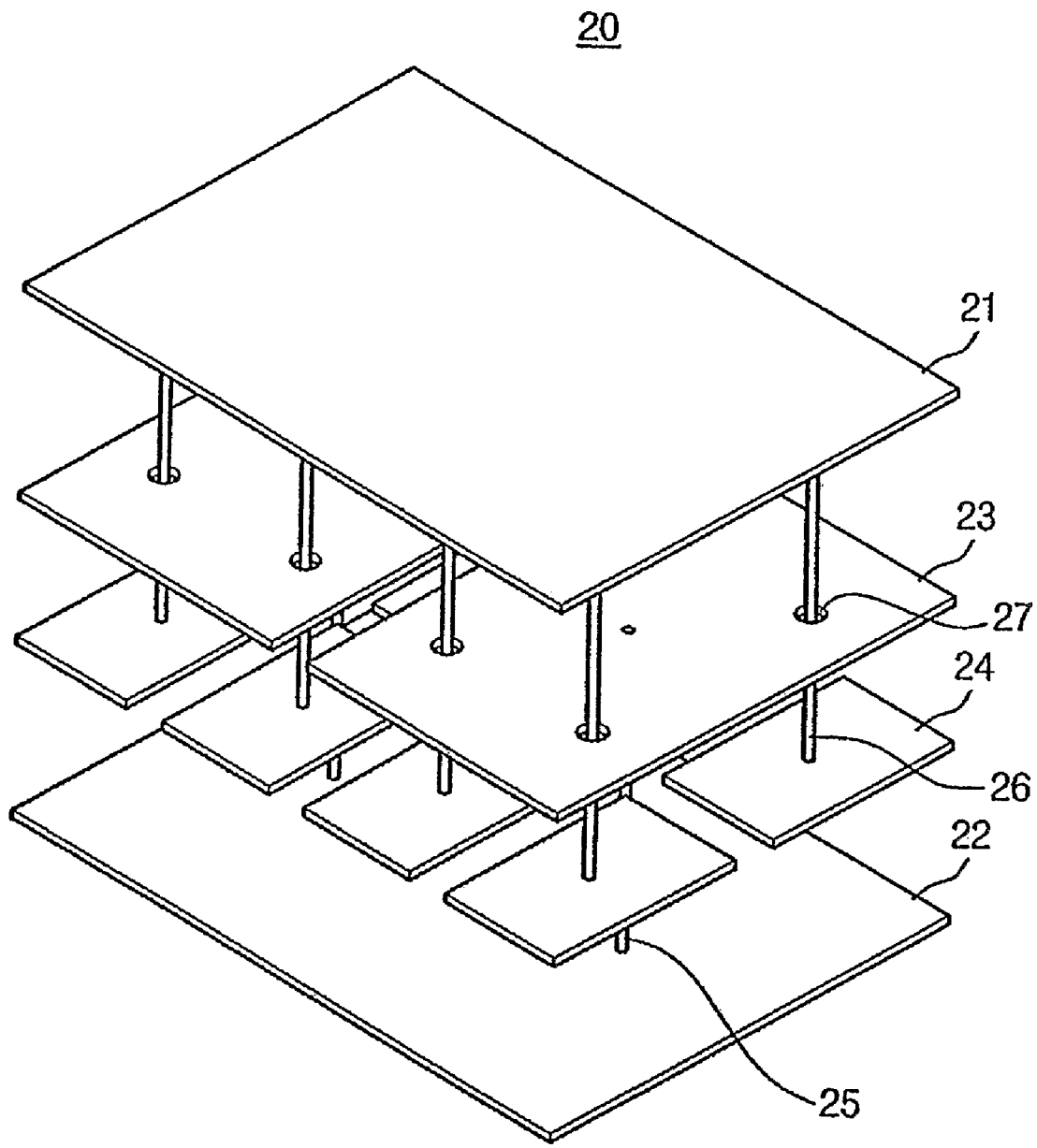
FIG. 2 is a perspective view of a double-stacked EBG structure according to an embodiment of the present invention.

FIG. 2 is a perspective view of a double-stacked EBG structure according to an embodiment of the present invention.

The double-stacked EBG (DS-EBG) structure includes two or more EBG layers between a power plane and a ground plane spaced apart in parallel. Referring to FIG. 2, the double-stacked EBG structure has two EBG layers, that is, a first EBG layer 23 and a second EBG layer 24, between the power plane 21 and the ground plane 22.

The first and second EBG layers 23 and 24 are divided into small cells. The cell size of the first EBG layer 23 is different from that of the second EBG layer 24. The cells can have various shapes. For example, the cells may be square, hexagon, and so on. In any case, it is preferable to make efficient use of the area.

Generally, the cell size and the gap between the cells have a close relation to frequency and bandwidth of a desired stopband. Also, the spacing between vias is preferably smaller than the wavelength corresponding to the center frequency of the stopband. For this reason, the spacing between the vias is determined depending on the center frequency of the stopband. As mentioned in the background section, in existing double-stacked EBG structures, the spacing between the vias in turn imposes a limitation on the cell size, as a result of accommodating the vias in the gaps between the cells. Therefore, to adjust the inductance and the capacitance of the EBG structure, the overall height of the EBG structure, different dielectric materials, or both, have to be adjusted. In practice, however, the limitation of the entire size of the system or board, as well as manufacturing issues of integrating multiple dielectric materials with different mechanical and processing properties, make it difficult to design such existing EBG structures to have the desired inductance and capacitance.

In contrast, in the EBG structure 20 shown in FIG. 2, for at least one of the EBG layers 23, 24, the connecting vias pass through via holes formed in the other EBG layer. As a result, advantageously, the cell size of at least one of the EBG layers 23, 24 is not limited by accommodating the vias in gaps between the cells. Therefore, the spacing between vias, which is determined depending on the center frequency of the stopband as mentioned above, does not impose the undesired limitation on the cell size of both EBG layers.

The EBG layer 23 is connected to the ground plane 22 through the first via 25, and the second EBG layer 24 is connected to the power plane 21 through the second via 26. The first via 25 may be connected to the ground plane 22 while passing through an empty space where edges of the cells of the second EBG layer 24 are contacted. The second via 26 passes through a via hole 27 formed in the first EBG layer 23. It was found that the via hole 27 can have a negligible influence on the electromagnetic characteristic of the first EBG layer 23.

In LTCC technology manufacturing as an example of implementation, via holes 27 can be formed by punching or drilling in a ceramic tape and forming the pattern for the EBG layer 23 on one surface of the ceramic tape around the drill holes by printing or other known techniques. Stencil filling is then used to fill the holes, thereby forming the filled vias. Multiple tape layers are laminated to form the double-stacked EBG structure 20, Similarly, the blind vias, e.g. 25, can be readily achieved using LTCC.

The first EBG layer 23 has about four times the cell size of the second EBG layer 24, and the second EBG layer 24 has about four times the frequency of the stopband center frequency of the first EBG layer 23. The first EBG layer 23 and the power plane 21 form one EBG structure, and the second EBG layer 24 and the ground plane 22 form another EBG structure. Because the first EBG layer 23 is embedded between the power plane 21 and the second EBG layer 24, or the second EBG structure 24 is embedded between the ground plane 22 and the first EBG layer 23, the double-stacked EBG structure 20 can be implemented at a thickness equal to that of the conventional single-layer EBG structure 10.

The first EBG layer 23 and the second EBG layer 24 have different potentials. Additionally, cells in the EBG layer 23 overlap completely with an integer number of cells in the EBG layer 24, which results in an increased capacitance coupling between the EBG layers 23, 24, compared to existing double-stacked EBG structures in which vias connecting the cells are accommodated in the gaps between the cells of the other EBG layer. This advantageously can generate higher order EBG modes and multiple transmission zeros, and capacitance and inductance can be additionally obtained between the first EBG layer 23 and the second EBG layer 24. As described above, the capacitance and inductance of the EBG structure are an important factor in determining the center frequency and frequency band of the stopband. Therefore, the use of the double-stacked EBG structure 20 makes it possible to design for the center frequency and frequency band of the desired stopband more freely.

The double-stacked EBG structure 20 has two EBG structures that provide the sub stopbands having the center frequency and frequency band determined by the physical specification. The entire stopband has a shape formed by the combination of the sub stopbands. If the center frequency and the frequency band are determined such that two sub stopbands are contiguous, the entire stopband can have a very wide bandwidth.

Figure 3:
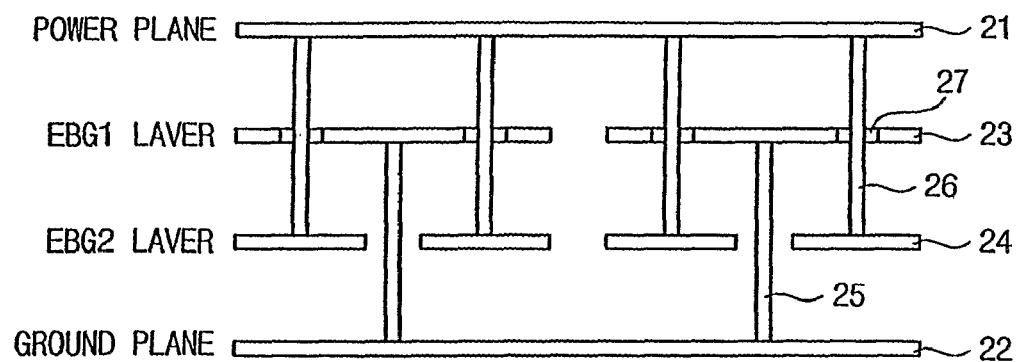
FIG. 3 is a cross-sectional view of the double-stacked EBG structure of FIG. 2.

FIG. 3 is a sectional view of the double-stacked EBG structure 20. Referring to FIG. 3, the first EBG layer 23 and the second EBG layer 24 are arranged between the power plane 21 and the ground plane 22. The first EBG layer 23 is connected to the ground plane 22 through vias 25, and the second EBG layer 24 is connected to the power plane 21 through vias 26. The first EBG layer 23 and the second EBG layer 24 are divided into cells having different sizes. The cell size of the first EBG layer 23 is larger than that of the second EBG layer 24. However, in other embodiments, the cell size of the first EBG layer 23 may be smaller than that of the second EBG layer 24. The vias 25 and 26 may be connected to the planes 21 and 22 at the center portions of the respective cells. Accordingly, the via 26 of the second EBG layer 24 having the small cell size may be connected to the power plane 21 through the via hole 27 of the first EBG layer 23. The dielectric is filled between the layers. A low-temperature co-fired ceramic (LTCC) is used as the dielectric.

In the double-stacked EBG structure 20, the thickness of each dielectric layer 30, 32, 34 is advantageously uniform. As mentioned above, in existing double-stacked EBG structures, due to the limitation on cell size variation for the EBG layers, typically different dielectric thickness values are required to try and achieve a desired center frequency and bandwidth of the stopband. While the use of different dielectric thickness values can be readily accommodated in systems based on printed circuit board (PCB) manufacturing processes, such different dielectric thickness values are typically undesirable for LTCC manufacturing processes. In contrast, the uniform thickness dielectric layers 30, 32 and 34 utilized in the double-stacked EBG structure 20 are readily suitable for standard LTCC manufacturing processes, and can advantageously achieve an implementation with a thinner total substrate thickness compared to existing double-stacked EBG structures.

Figure 4:
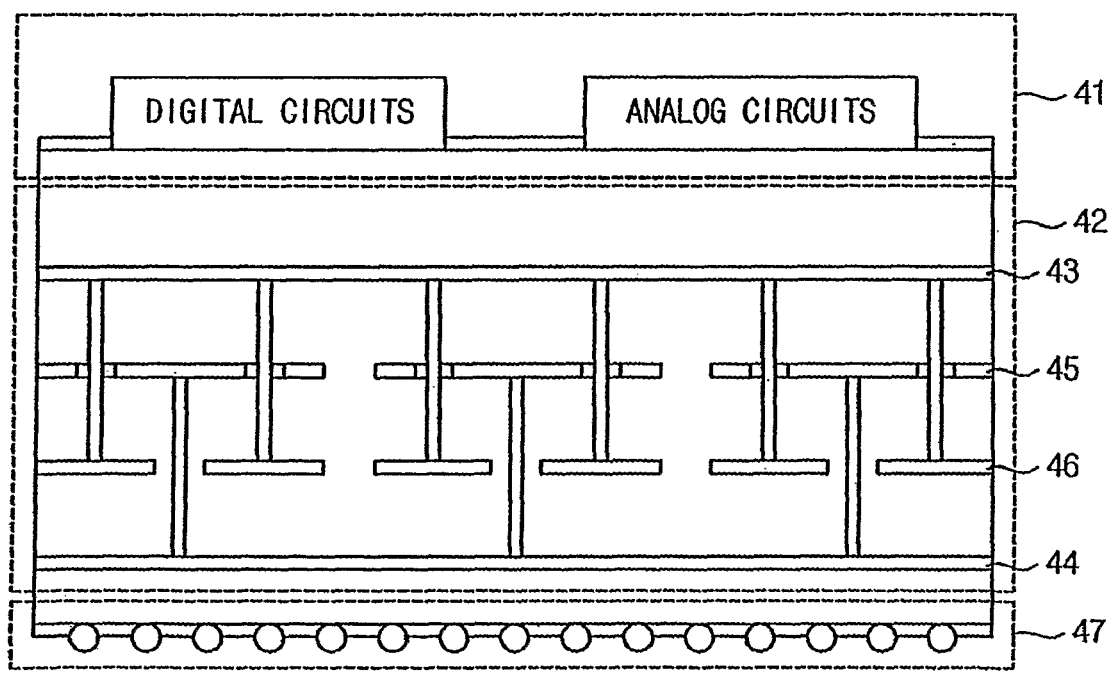
FIG. 4 is a cross-sectional view of a system-in-package having a double-stacked EBG structure according to an embodiment of the present invention.

FIG. 4 is a sectional view of a SiP having a double-stacked EBG structure according to an embodiment of the present invention.

Referring to FIG. 4, the system-in-package 40 includes a semiconductor chip 41 and a package board 42. The semiconductor chip 41 is a mixed signal system and includes a digital circuit part and an analog circuit part at an upper portion. The package board 42 is provided under the semiconductor chip 41. The package board 42 has a double-stacked EBG structure in which a power plane 44 and a ground plane 43 are embedded and at least two EBG layers 45 and 46 are disposed between the power plane 44 and the ground plane 43.

Figure 1:
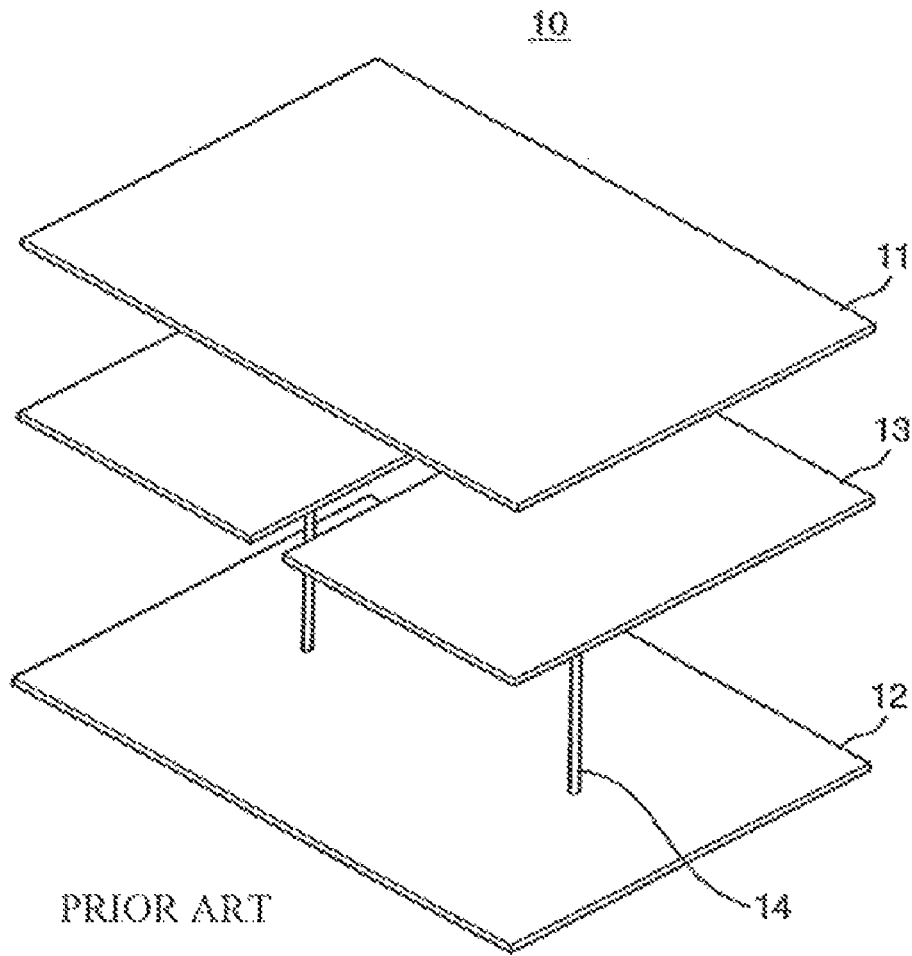
FIG. 1 is a perspective view of a conventional EBG structure.
Figure 5A:
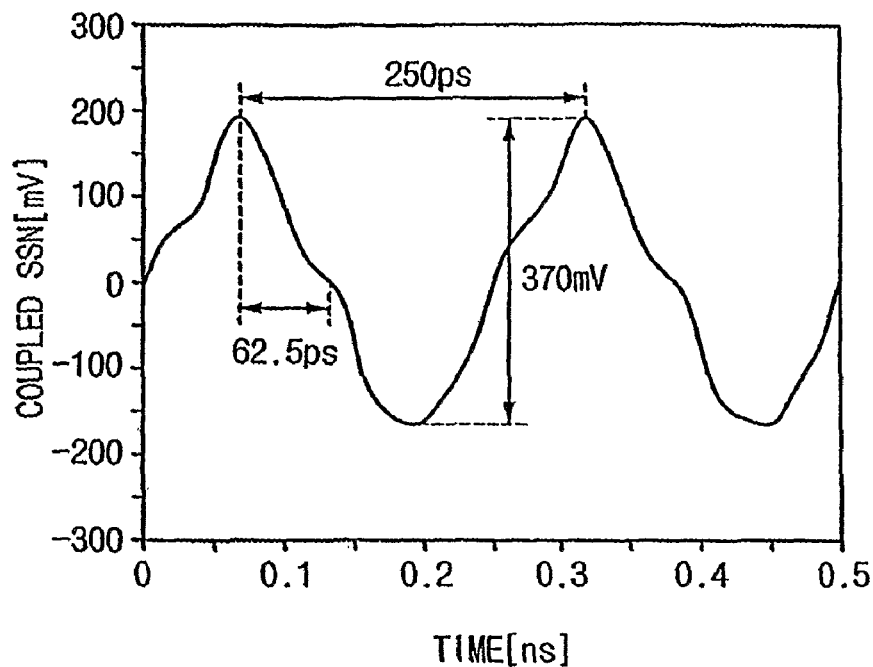
FIGS. 5A, 5B and 5C are graphs illustrating results when a switching noise signal is measured in time domain in case where the system-in-package has no the EBG structure, in case where the system-in-package has the EBG structure of FIG. 1, and in case where the system-in-package has the EBG structure of FIG. 2, respectively.
Figure 5B:
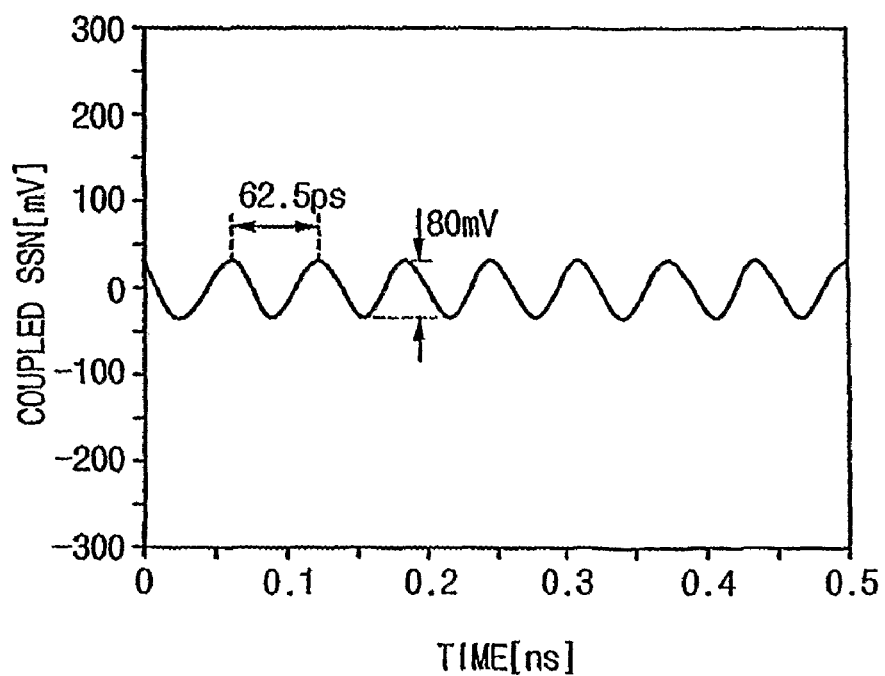
Figure 5C:
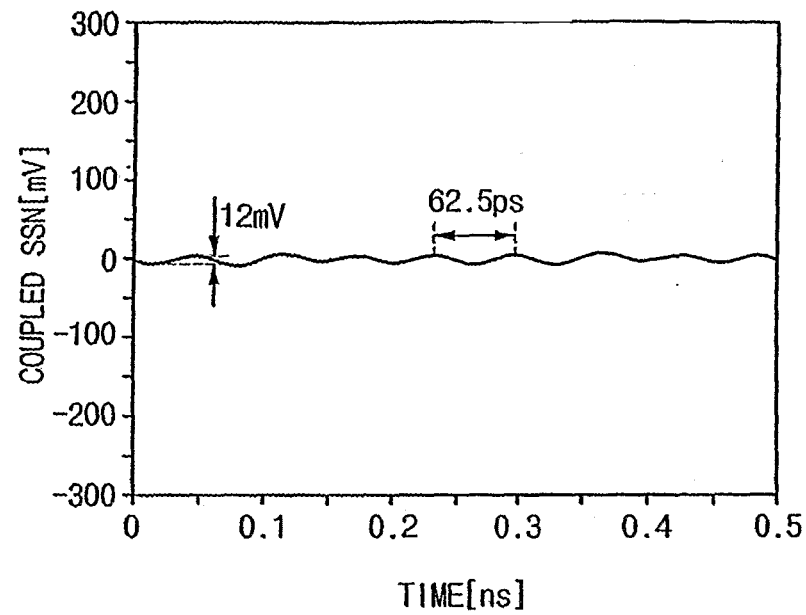

FIGS. 5A, 5B and 5C are graphs illustrating results when a switching noise signal is measured in the time domain in case where the SiP has no EBG structure, in case where the SiP has the EBG structure of FIG. 1, and in case where the SiP has the EBG structure of FIG. 2, respectively.

The test was performed using a test apparatus that has a 20 mm×20 mm×10 μm power plane and a 20 mm×20 mm×10 μm ground plane formed of gold conductor and low-loss LTCC layers having a thickness of 0.1 mm. The cell size of the EBG layer of FIG. 1 was 3.8 mm×3.8 mm, the cell gap was 0.2 mm, a distance from the power distribution surface was 0.1 mm, and a distance from the ground plane was 0.2 mm. In the EBG structure of FIG. 2, the cell size of the first EBG layer was 3.8 mm×3.8 mm, the cell gap was 0.2 mm, and a distance from the power distribution surface was 0.1 mm. The cell size of the second EBG layer was 1.8 mm×1.8 mm, the cell gap was 0.2 mm, and a distance from the ground plane was 0.1 mm. The gap between the two EBG layers was 0.1 mm.

In FIGS. 5A, 5B and 5C, a vertical axis represents a measured switching noise (mV) and a horizontal axis represents time (ns). Referring to FIG. 5A, when the EBG structure was not employed, noise was 370 mV. Referring to FIG. 5B, when the conventional EBG structure was employed, noise was 80 mV. Referring to FIG. 5C, when the EBG structure of the present invention was employed, noise was 12 mV. That is, it can be seen that noise was remarkably reduced.

Figure 6A:
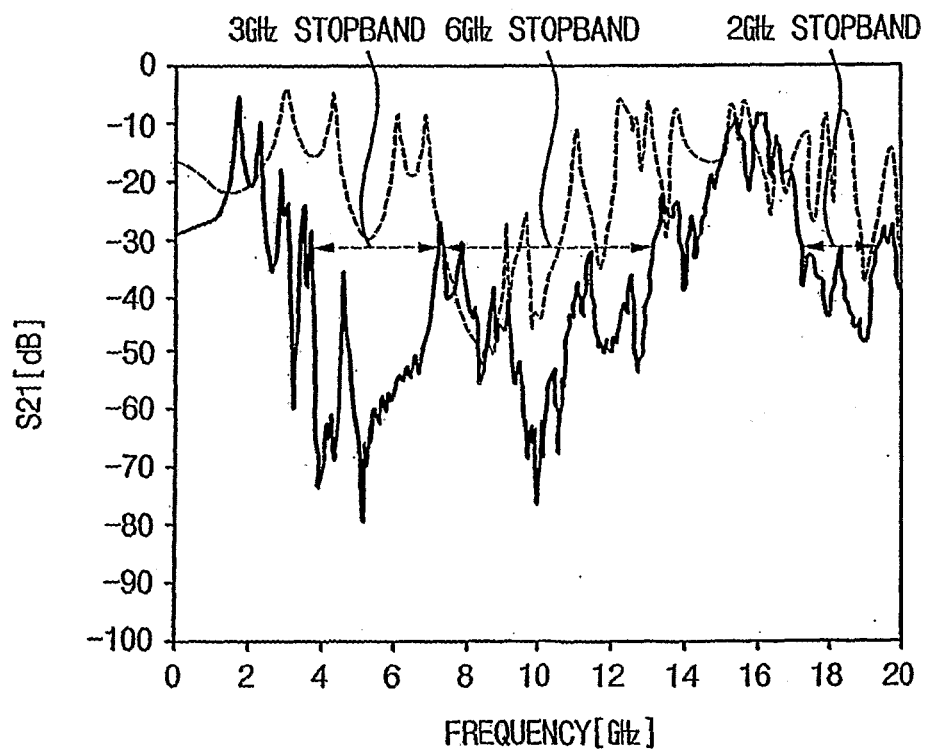
FIGS. 6A and 6B are graphs illustrating results when a power noise coupling coefficient between two positions on a power plane is measured in frequency domain in case where the system-in-package has the EBG structure of FIG. 1 and in case where the system-in-package has the EBG structure of FIG. 2, respectively, and in both cases compared to the case where the system-in-package has no EBG structure.
Figure 6B:
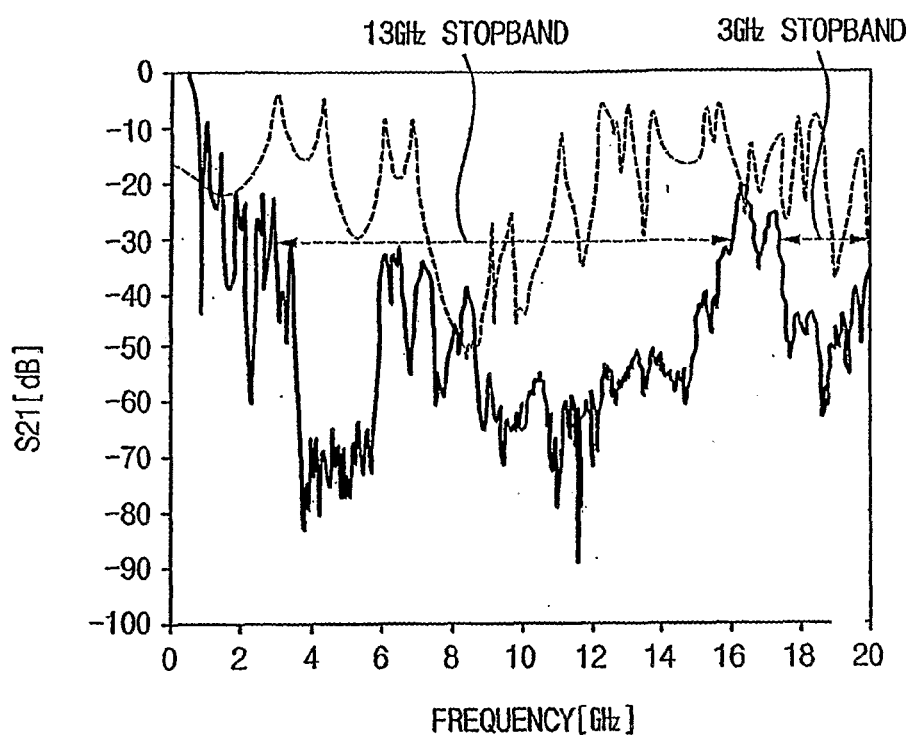

FIGS. 6A and 6B are graphs illustrating results when a power noise coupling coefficient S21 between two positions 1 and 2 on a power plane is measured in frequency domain in case where the SiP has the EBG structure of FIG. 1 and in case where the SiP has the EBG structure of FIG. 2, respectively, and in both cases compared to the case where the SiP has no EBG structure.

The test was performed using the test apparatus described in FIG. 5. In FIGS. 6A and 6B, a dotted line represents the measured power noise coupling coefficient when the EBG structure is not employed. The stopband means a band having the measured noise coupling coefficient lower than −30 dB.

Referring to FIG. 6A, when the conventional EBG structure was employed, the stopbands appeared at 3.5 GHz-6.5 GHz (about 3 GHz), 6.6 GHz-12.5 GHz (about 6 GHz), and 17.5 GHz-19.5 GHz (about 2 GHz). Referring to FIG. 6B, when the EBG structure of the present invention was employed, the stopbands appear at 3 GHz-16 GHz and 17.5 GHz-21 GHz. The case of FIG. 6B has a bandwidth of 13 GHz and 3. GHz, which is wider than the case of FIG. 6A. This illustrates that in the described double-stacked EBG structure, the cell dimensional parameters are designed to achieve an overlap of individual EBG stopbands to achieve an increase in stopband bandwidth. Since vias for at least one of the EBG layers pass through via holes in the other EBG layer, ratios of cell sizes between the two EBG layers can e.g. be about 2:1, and can be extended to multiple of integers 3:1, etc.

In the described double-stacked EBG structure of the present invention, the cells having different areas are arranged in different layers, and the cells of the different layers are connected to different planes. The double-stacked EBG structure of the present invention can provide the stopband having the wider frequency band compared with the conventional EBG structure.

The described system-in-package and the printed circuit board having the described double-stacked EBG structure can be implemented for mixed-signal (analog and digital) applications.

The described system-in-package and the printed circuit board having the described double-stacked EBG structure can suppress the propagation of the switching noise by using the stopband having the wide frequency band.

It will be appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive.

For example, although the LTCC-based system-in-package has been described, the present invention can also be applied to a printed circuit board.

What is claimed is:

1. A double-stacked electromagnetic bandgap (EBG) structure comprising:
a first conductive plane and a second conductive plane spaced apart in parallel;
at least two EBG layers embedded in parallel between the first conductive plane and the second conductive plane, the at least two EBG layers having different stopband characteristics; and
a plurality of vias for connecting the at least two EBG layers respectively to one of the first and second conductive planes;
wherein at least the vias connecting one of the EBG layers pass through via holes in cells of another EBG layer.

2. The double-stacked EBG structure according to claim 1, wherein the at least two EBG layers are formed such that the stopbands are contiguous.

3. The double-stacked EBG structure according to claim 1, wherein the at least two EBG layers have different cell sizes.

4. The double-stacked EBG structure according to claim 1, wherein the first conductive plane is a power plane and the second conductive plane is a ground plane.

5. The double-stacked EBG structure according to claim 4, wherein the cell size of the EBG layer connected to the power plane is smaller than that of the EBG layer connected to the ground plane.

6. The double-stacked EBG structure according to claim 1, wherein the cells have a substantially rectangular shape.

7. The double-stacked EBG structure according to claim 1, further comprising:
a non-conductive layer or a dielectric layer formed between the conductive planes and the EBG layers.

8. The double-stacked EBG structure according to claim 7, wherein the dielectric layer is a low-temperature co-fired ceramic (LTCC).

9. The double-stacked EBG structure according to claim 8, wherein the dielectric layers between the conductive layers and the respective EBG layers have a uniform thickness.

10. The double-stacked EBG structure according to claiml, wherein a ratio of a cell size in one EBG layer to a cell size in another EBG layer is equal to or greater than 2:1.

11. The double-stacked EBG structure according to claim 1, wherein each cell in one EBG layer overlaps an integer number of cells in another EBG layer.

12. An electronic device comprising:
an electronic circuit having a predetermined function; and
a board for suppressing propagation of switching noise, the board including:
a first conductive plane and a second conductive plane spaced apart in parallel;
at least two EBG layers embedded in parallel between the first conductive plane and the second conductive ground plane, the at least two EBG layers having different stopband characteristics; and
a plurality of vias for connecting the at least two EBG layers respectively to one of the first and second conducive planes;
wherein at least the vias connecting one of the EBG layers pass through via holes in cells of another EBG layer.

13. The electronic device according to claim 12, wherein the electronic circuit is a mixed signal semiconductor circuit to process both a digital signal and an analog signal, and the electron device is a system-in-package.

14. The electronic device according to claim 12, wherein the at least two EBG layers are formed such that the stopbands are contiguous.

15. The electronic device according to claim 12, wherein the at least two EBG layers have different cell sizes.

16. The electronic device according to claim 12, wherein the first conductive plane is a power plane and the second conductive plane is a ground plane.

17. The electronic device according to claim 16, wherein the cell size of the EBG layer connected to the power plane is smaller than that of the EBG layer connected to the ground plane.

18. The electronic device according to claim 12, wherein the cells have a rectangular shape.

19. The electronic device according to claim 12, further comprising:
   a non-conductive layer or a dielectric layer formed between the conductive planes and the EBG layers.

20. The electronic device according to claim 12, wherein the dielectric layer comprises a low-temperature co-fired ceramic (LTCC) dielectric layer.

21. The electronic device according to claim 20, wherein the dielectric layers between the conductive layers and the respective EBG layers have a uniform thickness.

22. The electronic device according to claim 12, wherein each cell in one EBG layer overlaps an integer number of cells in another EBG layer.

23. The electronic device according to claim 12, wherein a ratio of a cell size in one EBG layer to a cell size in another EBG layer is equal to or greater than 2:1.

24. A method for suppressing electromagnetic noise in an electronic device having a first conductive plane and a second conductive plane, comprising:
   forming at least two EBG layers having different stopbands between the first conductive plane and the second conductive plane in parallel; and
   connecting the at least two EBG layers respectively to one of the first and second conductive planes through a plurality of vias;
   wherein at least the vias connecting one of the EBG layers pass through via holes in cells of another EBG layer.

25. The method according to claim 24, wherein the at least two EBG layers are formed such that the stopbands are contiguous.

* * * * *

UNITED STATES PATENT AND TRADEMARK OFFICE
CERTIFICATE OF CORRECTION

| | | |
|---|---|---|
| PATENT NO. | : 8,159,413 B2 | |
| APPLICATION NO. | : 12/513354 | |
| DATED | : April 17, 2012 | |
| INVENTOR(S) | : Jongbae Park et al. | |

It is certified that error appears in the above-identified patent and that said Letters Patent is hereby corrected as shown below:

IN THE CLAIMS:

Column 8, Claim 10, Line 38: Replace "according to claim1" with --according to claim 1--

Signed and Sealed this
Eleventh Day of September, 2012

David J. Kappos
*Director of the United States Patent and Trademark Office*